(12) United States Patent
Horie

(10) Patent No.: US 8,975,740 B2
(45) Date of Patent: Mar. 10, 2015

(54) SEMICONDUCTOR MODULE

(71) Applicant: Fuji Electric Co., Ltd., Kawasaki-shi, Kanagawa-ken (JP)

(72) Inventor: Shunta Horie, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/109,233

(22) Filed: Dec. 17, 2013

(65) Prior Publication Data
US 2014/0167235 A1  Jun. 19, 2014

(30) Foreign Application Priority Data

Dec. 19, 2012  (JP) .................................. 2012-277224

(51) Int. Cl.
*H01L 23/48* (2006.01)
*H01L 23/495* (2006.01)
(Continued)

(52) U.S. Cl.
CPC ...... *H01L 23/49544* (2013.01); *H01L 21/4825* (2013.01); *H01L 23/4334* (2013.01); *H01L 25/072* (2013.01); *H01L 23/049* (2013.01); *H01L 24/29* (2013.01); *H01L 24/32* (2013.01); *H01L 24/45* (2013.01); *H01L 24/48* (2013.01); *H01L 24/83* (2013.01); *H01L 2224/291* (2013.01); *H01L 2224/32227* (2013.01); *H01L 2224/45124* (2013.01); *H01L 2224/48227* (2013.01); *H01L 2224/73265* (2013.01); *H01L 2224/83801* (2013.01)
USPC ....................................................... 257/693

(58) Field of Classification Search
CPC ................ H01L 2924/01079; H01L 2924/14; H01L 2924/3011; H01L 2924/15312; H01L 23/26; H01L 23/051; H01L 23/041; H01L 27/14618; H01L 25/0657; H01L 2224/48091
USPC ................................ 257/678–733, 787–796, 257/E23.001–E23.194
See application file for complete search history.

(56) References Cited

U.S. PATENT DOCUMENTS 7,242,584 B2 *  7/2007  Kroneder ....................... 361/714
2005/0093137 A1 *  5/2005  Ishikawa et al. ............... 257/712
(Continued)

FOREIGN PATENT DOCUMENTS

DE  10100460 A1  7/2002
EP  2216814 A2  8/2010

OTHER PUBLICATIONS

Europe Patent Office, "Search Report for EP 13195866.2," Apr. 7, 2014.

*Primary Examiner* — Yu-Hsi D Sun
(74) *Attorney, Agent, or Firm* — Manabu Kanesaka

(57) ABSTRACT

A semiconductor module has a metallic base plate; an insulated circuit board fixed on the metallic base plate; a semiconductor element mounted on the insulated circuit board; a resin case to house the semiconductor element, and having an upper surface with an opening; a terminal exposed from the opening of the resin case to an outer portion in a vertical direction; and an insulating holding piece having a triangular or a rectangular cross-section and one surface contacting the terminal. The terminal has a projecting portion disposed inside the resin case to restrict a movement of the terminal in the vertical direction. The resin case has a first recess portion to fit the projecting portion and a second recess portion disposed on the upper surface of the resin case so that the holding piece pushes the projecting portion on the terminal toward the first recess portion for insertion.

6 Claims, 8 Drawing Sheets

(51) Int. Cl.
*H01L 21/48* (2006.01)
*H01L 23/433* (2006.01)
*H01L 25/07* (2006.01)
*H01L 23/049* (2006.01)
*H01L 23/00* (2006.01)

(56) References Cited

U.S. PATENT DOCUMENTS

2012/0256194 A1* 10/2012 Yoshihara et al. ............... 257/77
2014/0210067 A1* 7/2014 Takamiya et al. ............. 257/698

* cited by examiner

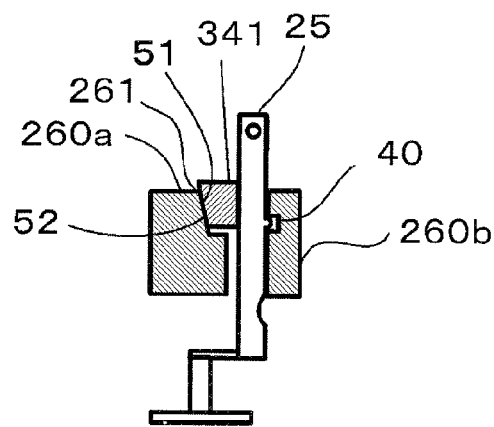
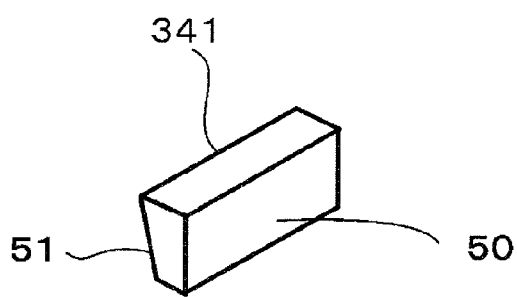
Fig. 9A  Fig. 9B
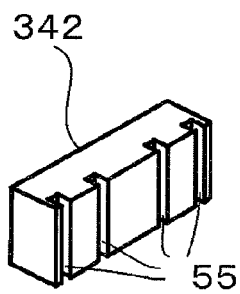
Fig. 10
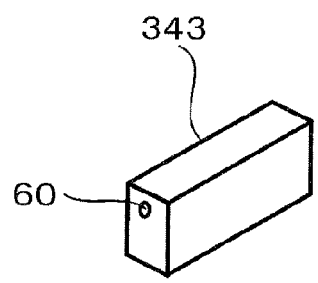
Fig. 11

SEMICONDUCTOR MODULE

CROSS-REFERENCE TO RELATED APPLICATION

This application is based on, and claims priority from Japanese Patent Application No. 2012-277224 filed on Dec. 19, 2012, contents of which are incorporated herein by reference.

BACKGROUND OF THE INVENTION

1. Field of the Invention

The present invention relates to a semiconductor module such as a power semiconductor module having a plurality of semiconductor elements in a single package.

2. Description of the Related Art

FIG. 12A is a perspective view of a conventional semiconductor module 100 for motor drive control containing a plurality of power semiconductor elements, for example, insulated gate bipolar transistors (IGBTs). This semiconductor module 100 comprises a metallic base plate 20, an insulated circuit board 21 on the base plate 20, and a plurality of power semiconductor elements 22 fixed at predetermined positions on the insulated circuit board 21 with solder as shown in FIG. 4. The semiconductor module 100 further comprises metallic main terminals 102, control terminals 103, and a resin case 104 that is a frame for protecting the power semiconductor elements 22 and for fixing the main terminals 102 and the control terminals 103 that are leading out of the housing. The space in the resin case 104 is filled with a resin composite in a gel stale. The power semiconductor elements are mounted on a metallic circuit pattern formed on the insulated circuit board 21 and connected with aluminum wires 23 between the metallic circuit pattern and metallic electrodes on the semiconductor elements 22.

FIG. 8 shows an equivalent circuit of a semiconductor module composed of semiconductor elements of IGBTs T1 and T2 and free wheel diodes (FWDs) D1 and D2 reverse-parallel-connected to the IGBTs T1 and T2, respectively. A resin composite in a gel state is filled in a space between the resin case 104 and a bottom plate that is the metallic base plate 20 for mounting these power semiconductor elements 22. The metallic main terminals 102, which are a C1 terminal, an E2 terminal, and a C1E2 terminal as shown in FIG. 12A, are connected externally through a screw holes 105 formed in the metallic main terminals 102 exposing to the center surface of the resin case 104. The auxiliary terminals 103, which are a g1 terminal, an e1 terminal, an e2 terminal, and a g2 terminal, are led out through the slits 106 formed in the end region of the surface of the resin case 104. The metallic base plate 20 has four holes for attaching itself to a heat sink at the corners of the base plate 20. The resin case 104 has an opening at the bottom thereof for the resin case 104 to be fitted to the base plate.

Patent Document 1 discloses a semiconductor device in which electrode terminals are ensured to be held on a thermoplastic resin housing to enhance reliability in assembling quality, and the electrode terminals are prevented from falling off from the resin housing due to vibration.

Patent Document 2 discloses a semiconductor module that includes a resin case, connection elements for external main connections and control connections, and an insulated substrate with a metallized surface. The insulated substrate mounting semiconductor elements is inserted into a bottom opening of the resin case.

Patent Document 3 discloses a semiconductor module with a high dielectric strength and high reliability in which a control terminal has a projecting portion at a position of passing through the resin case and an L-shaped portion is provided in the control terminal in order to avoid transmission of stress onto the insulated circuit board in attaching and detaching processes of a connector.

[Patent Document 1]
Japanese Utility Model Application Publication No. H05-006852 (Abstract and FIG. 1, in particular)
[Patent Document 2]
U.S. Pat. No. 6,597,585 (claim 1 and FIG. 3, in particular)
[Patent Document 3]
WO2012/0066833 pamphlet (Abstract and FIG. 1, in particular)

In the semiconductor module 100 shown by the perspective view of FIG. 12A, the resin injected in the resin case 104 is a resin composite in a gel state exhibiting flexibility that cannot rigidly fix the leading out terminals of the metallic main terminals 102 and the control terminals 103. Thus, the leading out terminals need to be fixed at the openings in the resin case 104 formed for leading out the terminals. Of the leading out terminals, the metallic main terminals 102 are held with the resin housing 104 and thus, the stress exerted in the processes of external connection is scarcely transmitted to the bottom portion of the main terminal.

As for the auxiliary terminals 103, however, after fixing the auxiliary terminals 103 onto the insulated circuit board 21, the auxiliary terminals 103 need to be easily inserted through the openings 107 for the auxiliary terminals formed in the resin case 104 and also to be securely held on the housing. To meet these requirements, the openings 107 for the auxiliary terminals, as shown in FIG. 12A, each have a configuration of a slit with a size that is slightly larger than the cross-sectional size of the terminal. In addition, the auxiliary terminal 103 is provided with a projecting portion and the resin case is provided with a notch to hold the terminal on the housing as shown in FIG. 12B. In FIG. 12B, the references 104a and 104b designates partial cross-sections of the resin case. The auxiliary terminals 103 each have a projecting portion 103a inside the resin case 104, and the resin case 104 has a recess 108 corresponding to the projecting portion 103a. The recess 108 restricts vertical movement of the projecting portion 103a. In the method of holding the terminals utilizing the projecting portion and notch, however, the terminals become easily disengaged in the longitudinal direction of the slit because the slit is formed with a little larger dimension. This is the case wherein an external force is exerted toward the left at the upper position of the auxiliary terminal 103 in FIG. 12B. If the slit length is decreased to avoid disengagement of the auxiliary terminal, insertion can be hardly carried out, and some stress may be exerted on the bottom portion of the auxiliary terminals in the inserting process. Thus, the reduction of the slit length is limited.

SUMMARY OF THE INVENTION

The present invention has been made in view of the foregoing and an object of the present invention is to provide a semiconductor module that solves the above-mentioned problems and that allows easy engagement between the auxiliary terminals and the resin case in the assembling process and avoids transmission of stress onto the bottom portion of the auxiliary terminals or onto the insulated circuit board in the process of attaching an external connector. A method of manufacturing such a semiconductor module is also provided.

A semiconductor module according to a first aspect of the present invention comprises a metallic base plate; an insulated circuit board fixed on the metallic base plate; a semiconductor element mounted on the insulated circuit board; a resin case to house the semiconductor element; and a terminal exposed from an upper surface of the resin case. The resin case is provided with an opening to expose the terminal on the upper face of the resin case. The terminal has a projecting portion disposed inside the resin case to restrict a vertical movement of the terminal. The semiconductor module comprises a holding piece made of an insulating material and having a triangular or quadrilateral cross-section and one surface contacting the terminal. The resin case includes a first recess portion to fit the projecting portion, and a second recess portion on an upper surface thereof to fit the holding piece so that the holding piece pushes the projecting portion on the terminal toward the first recess portion.

A semiconductor module according to a second aspect of the present invention is the semiconductor module of the first aspect of the invention, wherein the holding piece has an inclined surface on a surface opposite to a surface contacting the terminal, the inclined surface inclined to reduce a cross-section of the holding piece toward a lower portion, and a surface of the resin case corresponding to the inclined surface of the holding piece has an inclined surface to contact the inclined surface of the holding piece.

A semiconductor module according to a third aspect of the present invention is the semiconductor module of the first or second aspect of the invention, wherein the holding piece has a slit at a position corresponding to the terminal, and the slit inserted with an auxiliary terminal.

A semiconductor module according to a fourth aspect of the present invention is the semiconductor module of the any one of the first through third aspects of the invention, wherein the holding piece has at least two surfaces having a projecting portion or recess portion, and the resin case has a recess portion or projecting portion corresponding to the projecting portion or recess portion of the holding piece.

A semiconductor module according to a fifth aspect of the present invention is the semiconductor module of the any one of the first through fourth aspect of the invention, wherein the holding piece is adhered to the second recess on the resin case.

A sixth aspect of the present invention is a method of manufacturing a semiconductor module comprising steps of fixing a semiconductor element and a terminal on an insulated circuit board fixed on a metallic base plate; and fixing a resin case onto the metallic base plate, the resin case housing the semiconductor element and exposing a terminal from an opening provided on an upper surface of the resin case in a vertical direction. After the terminal is exposed from the opening using the resin case according to the first to fourth aspects, the holding piece according to the first to fourth aspects is inserted into the second recess portion according to the first to fourth aspects so that the holding piece pushes the projecting portion formed on the terminal toward the first recess on the resin case.

The present invention provides a semiconductor module and a method of manufacturing the same in which the resin case is easily engaged with the auxiliary terminals in the assembly process and stress transmission onto the bottom portion of the auxiliary terminals or onto the insulation circuit board is avoided in the process of attaching an external connector.

BRIEF DESCRIPTION OF DRAWINGS

FIG. 9A is a sectional view of an essential part of a semiconductor module according to the second embodiment of the invention.

FIG. 9B is a perspective view of a holding piece according to the second embodiment of the invention.

FIG. 10 is a perspective view of a holding piece according to the third embodiment of the invention.

FIG. 11 is a perspective view of a holding piece according to the fourth embodiment of the invention.

DETAILED DESCRIPTION OF THE INVENTION

The following describes details of semiconductor modules according to some preferred embodiments of the present invention with reference to accompanying drawings. In the description and drawings of the embodiments below, the same structures are given the same symbols and repeated description thereon is avoided. The drawings are not depicted with an accurate scale for better understanding. The present invention is not limited to the embodiments described below but various modifications are possible without departing from the spirit and scope of the invention.

First Embodiment

Figure 1:
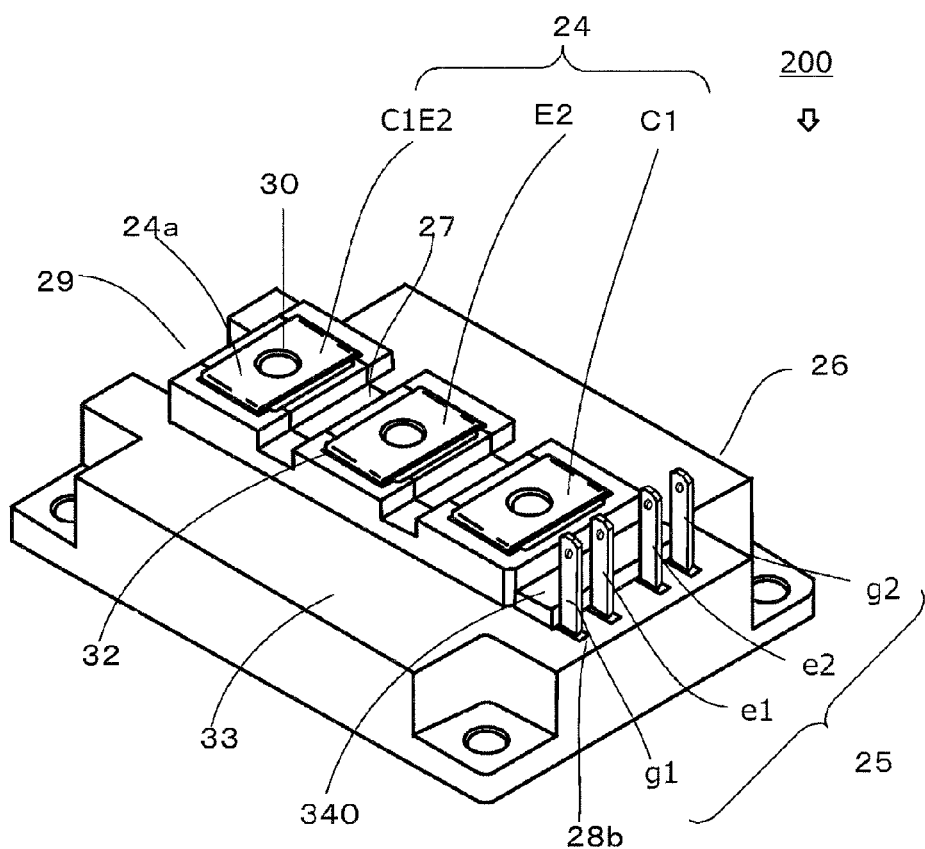
FIG. 1 is a perspective view of a semiconductor module according to the first embodiment of the present invention.
Figure 3:
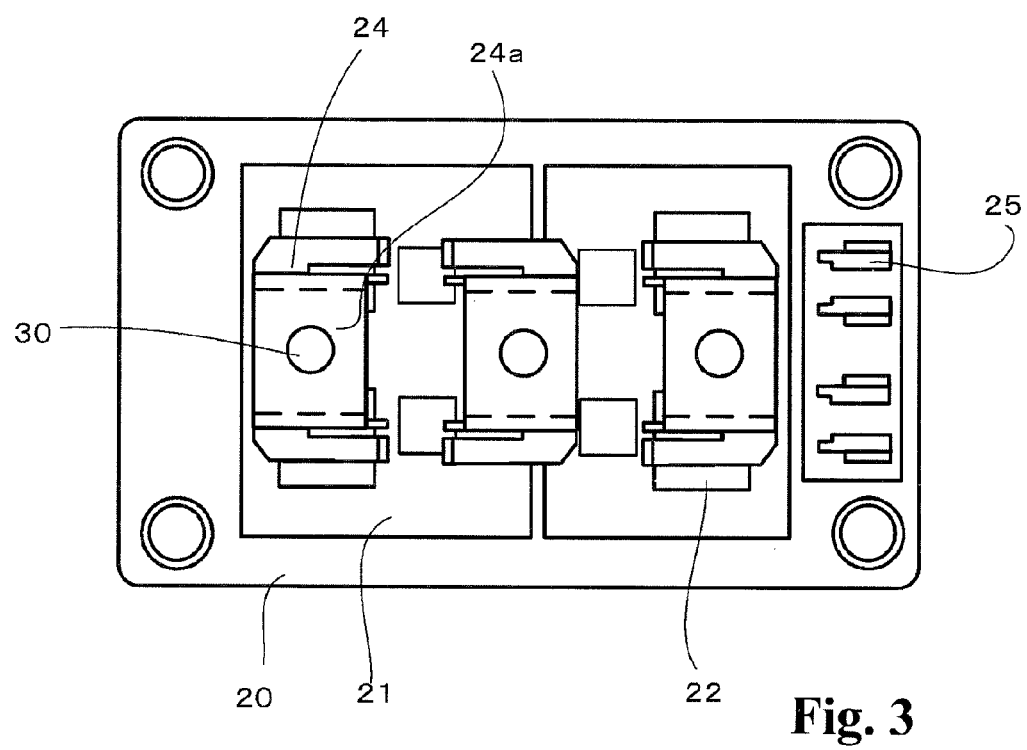
FIG. 3 is a plan view of a semiconductor module with the resin case being removed according to the first embodiment of the invention.

FIG. 1 is a perspective view of a semiconductor module according to the first embodiment of the invention. FIG. 3 is a plan view of the semiconductor module with a resin case being removed, according to the first embodiment of the invention. FIG. 3, however, omits wiring with aluminum wire bonding, solder, and a metallic wiring pattern for the purpose of avoiding a complicated drawing.

Figure 4:
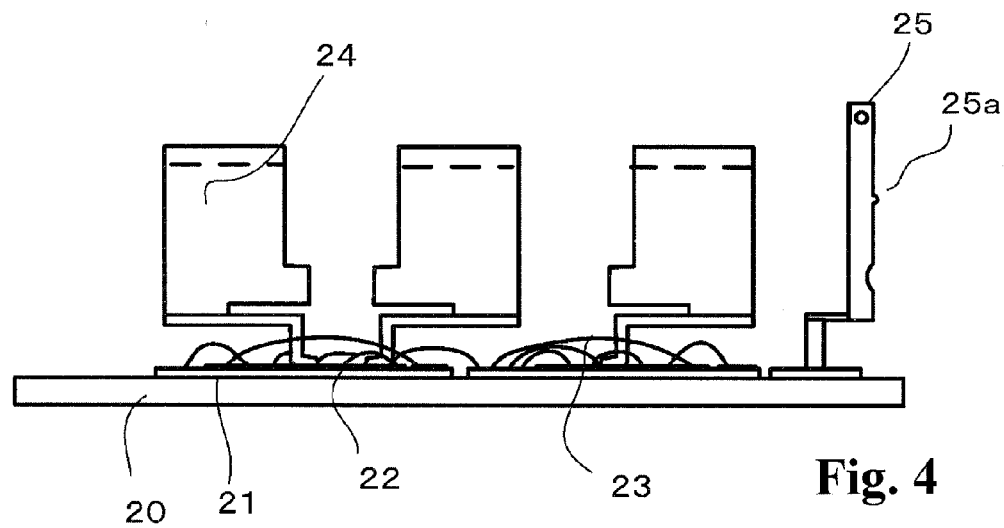
FIG. 4 is a front view of a semiconductor module with the resin case being removed according to the first embodiment of the invention.
Figure 5:
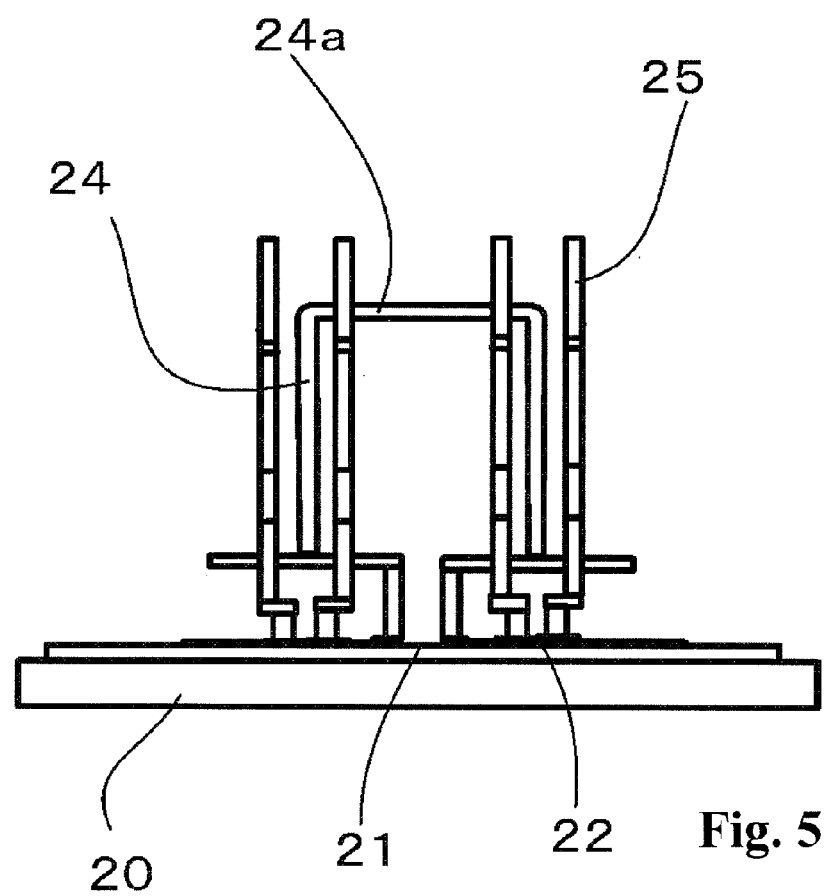
FIG. 5 is a side view, viewed from the side of the auxiliary terminals, of a semiconductor module with resin case being removed according to the first embodiment of the invention.
Figure 6A:
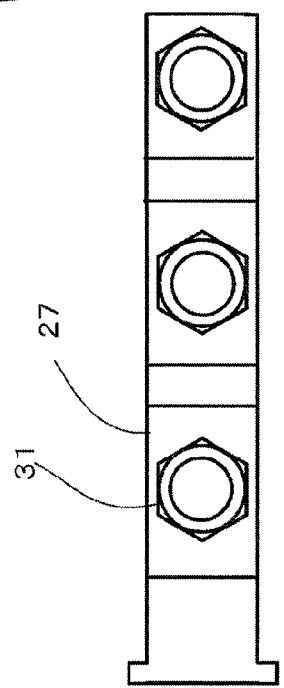
FIG. 6A is a plan view of the nut globe of the resin case of the semiconductor module according to the first embodiment of the invention.
Figure 6B:
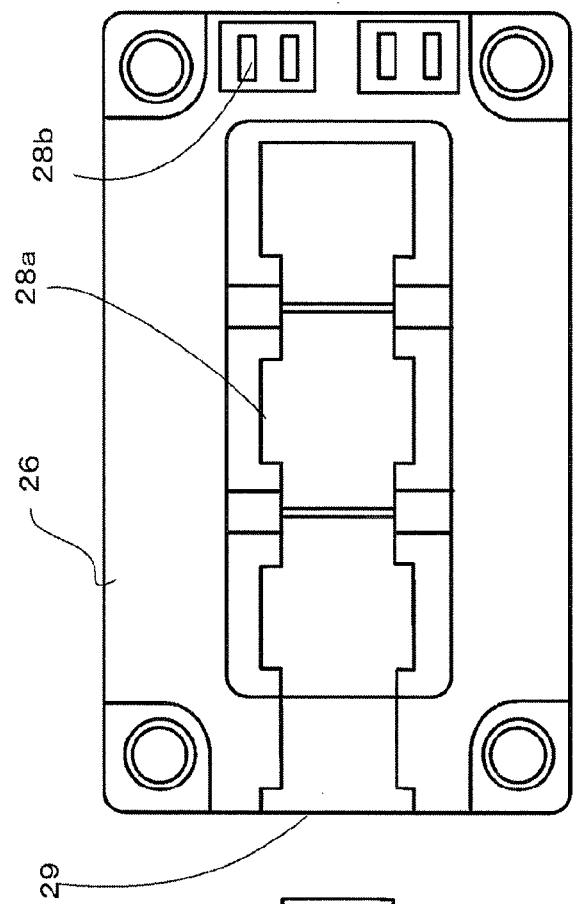
FIG. 6B is a plan view of the resin case with the nut globe being removed from the semiconductor module according to the first embodiment of the invention.
Figure 7:
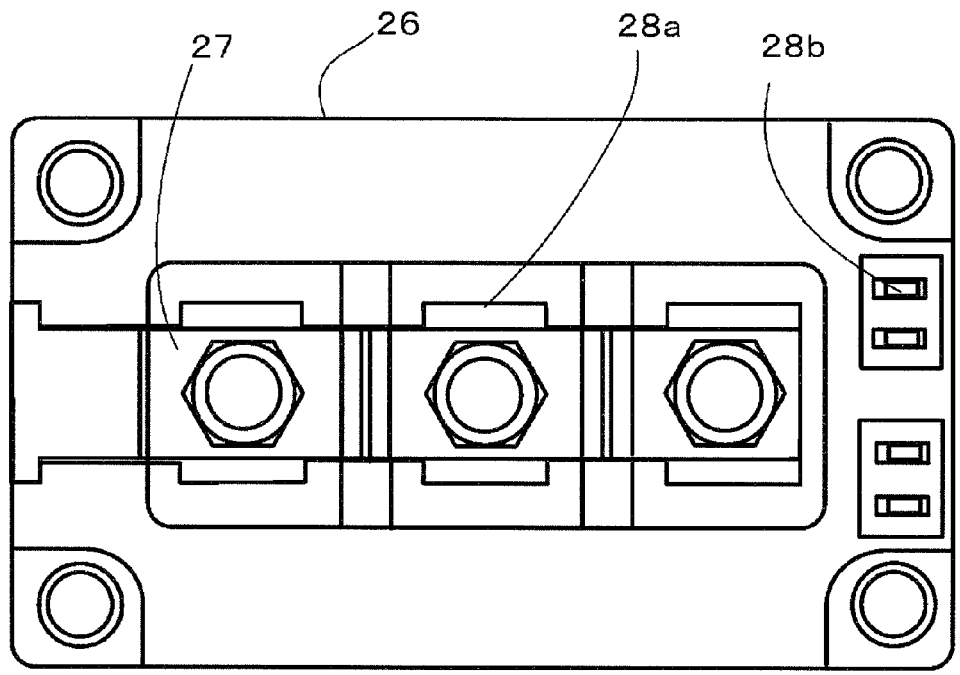
FIG. 7 is a plan view of the resin case with the nut globe being engaged therewith of the semiconductor module according to the first embodiment of the invention.
Figure 8:
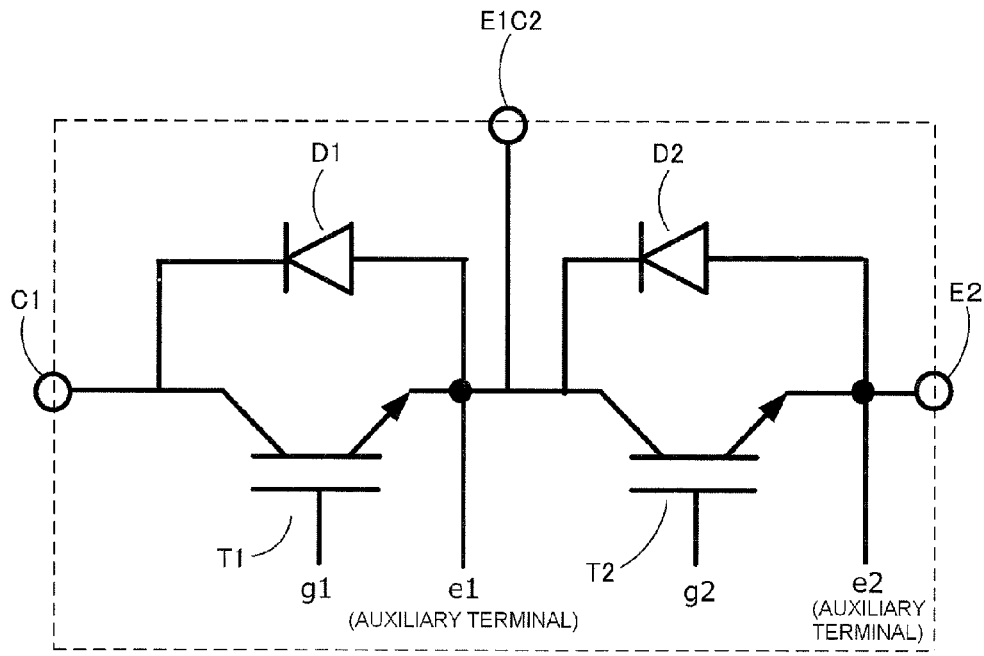
FIG. 8 shows an equivalent circuit of the semiconductor module according to the first embodiment of the invention.
Figure 12B:
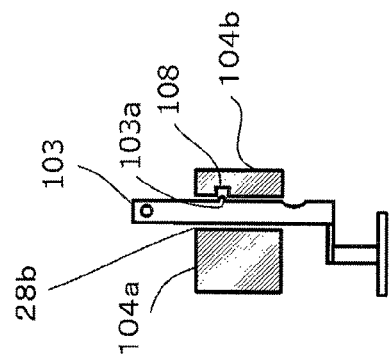
FIG. 12B is a sectional view of an essential part of the semiconductor module of FIG. 12A.
Figure 12A:
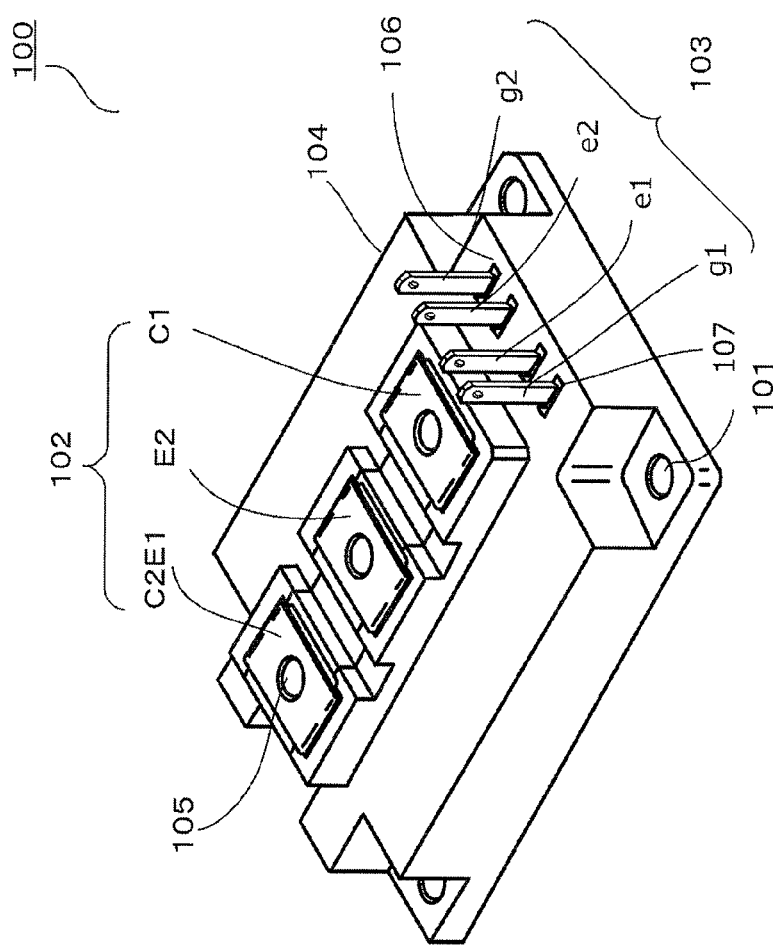
FIG. 12A is a perspective view of a semiconductor module according to a conventional technology.

FIG. 4 is a front view of the semiconductor module with a resin case being removed. FIG. 5 is a side view of the semiconductor module with a resin case being removed viewed from the side of auxiliary terminals, wherein aluminum wires are omitted in the drawing. FIG. 6B is a plan view of the resin case of the semiconductor module with a nut globe 27 being removed from the resin case; and FIG. 6A is a plan view of the nut globe 27, which is a nut-receiving plastic body having nuts embedded at recessed places on the nut globe. FIG. 7 is a plan view of the semiconductor module with the nut globe 27 inserted from the side opposite to the auxiliary terminals and fitted to the resin case 26. FIG. 8 shows an equivalent circuit of the semiconductor module of the invention. A semiconductor module constructed from the equivalent circuit of FIG. 8 is only one example of the present invention, and other circuit structures should not be excluded.

This semiconductor module 200 has a plurality of semiconductor elements including IGBTs and FWD (free-wheeling diodes) to construct the aforementioned circuit mounted and soldered on a wiring pattern on an insulated circuit board, and housed in the resin case.

The semiconductor module 200 of the first embodiment is described in detail below referring to FIGS. 1 through 5.

This semiconductor module 200 comprises a metallic base plate 20, an insulated circuit board 21 fixed on the metallic base plate 20, semiconductor elements 22 such as an IGBT and a FWD fixed at specified places on the insulated circuit board 21 with solder, terminals of main terminals 24 for main current and auxiliary terminals 25 including control terminals, and a resin case 26 having a bottom opening with dimensions to fit to a bottom plate of the metallic base plate 20.

The resin case 26 has a nut globe 27 that is inserted from an inserting hole 29 at the center-left side of the resin case 26 as shown in FIGS. 6 and 7. Inserting process is as follows. The resin case 26 is fitted onto the metallic base plate 20 having the semiconductor elements assembled thereon, and the leading out main terminals 24 of C1, E2, and C1E2 and the auxiliary terminals 25 of g1, e1, e2, and g2 are led out from the openings 28a and 28b for terminals provided on the surface of the resin case 26. Then, the nut globe 27 is inserted from the inserting hole 29 at the left side of the resin case 26. The positions of nut seat recesses 31 in the nut globe 27 are adjusted just beneath the attaching holes 30 for external terminals in the top parts 24a (FIGS. 3 and 5) of the lead-out main terminals 24 (hereinafter simply referred to as main terminals). In order to facilitate to insert the nut globe 27 from the inserting hole 29 at the side of the resin case 26, a step is formed on the center surface 32 (in FIG. 1) of the resin case 26, the center surface 32 being used for inserting the nut globe 27 and higher than the peripheral surface 33. The nut globe 27 has the nut seat recesses 31 at the positions corresponding to the attaching holes 30 for external terminals formed in the top part 24a of the main terminal 24, each nut seat recess 31 having an embedded nut. A screw of the external terminal is screwed into the nut to fasten the main terminal 24 with the screw and nut to connect the main terminal 24 to the external terminal. The present invention needs a structure having a step between the center surface 32 and the peripheral surface 33 of the resin case 26, the center surface 32 being higher than the peripheral surface 33 and the step being disposed at a certain distance from the auxiliary terminals. Nevertheless, the present invention does not have necessarily a structure that uses the nut globe (or a resin body for nut receiving).

The auxiliary terminals 25 are four terminals g1, e1, e2, and g2 and leading out from openings 28b of the resin case as shown in FIGS. 1 and 7. The auxiliary terminal 25 has a projecting portion 25a contacting the side of the resin case 26 at the opening 28b for the auxiliary terminal when the auxiliary terminal 25 is inserted through the opening 28b. The projecting portion 25a is shown in FIG. 4 and provided for the purpose of fixing the auxiliary terminal 25. A recess 40, which is a first recess, is formed in the resin case 26 at the side of the opening 28b to receive the projecting portion 25a and to be engaged with the projecting portion thereby rigidly fastening the auxiliary terminal 25.

If the auxiliary terminals 25 are appropriately fixed, even though a downward force is exerted on the auxiliary terminals 25 in the process of inserting a connector to the auxiliary terminals 25 to connect the auxiliary terminals 25 to external terminals (not shown in the figures), the exerted force is scarcely transmitted to the bottom part of the auxiliary terminals or the insulated circuit board below the auxiliary terminals inside the resin case 26. However, the openings 28b are formed with slightly larger dimensions than the cross-section of the auxiliary terminal in order to facilitate inserting the auxiliary terminals 25. As a result, when a certain force in the direction of longer side of the openings 28b is exerted on the auxiliary terminal 25, the fixing force on the auxiliary terminals with the projecting portion 25a diminishes and the projecting portion 25a does not properly carry out the function to block an external force. The loss of the function to block the external force would cause bending at the bottom portion of the auxiliary terminal 25 to lower the top position of the auxiliary terminal, which leads to poor external connection. The insulated circuit board may also be broken.

Figure 2A:
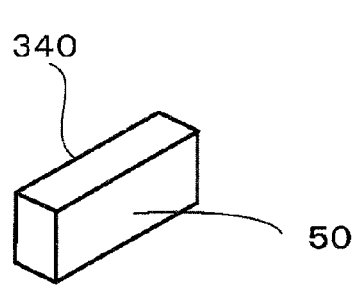
FIG. 2A is a perspective view of a holding piece in the semiconductor module according to the first embodiment of the invention.
Figure 2B:
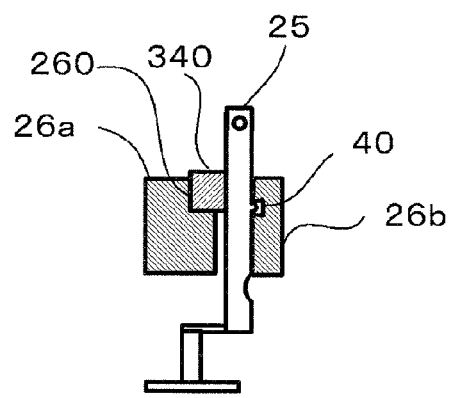
FIG. 2B is a sectional view of an essential part of the semiconductor module according to the first embodiment of the invention.

Accordingly, in an embodiment of the present invention, the step between the central surface 32 and the peripheral surface 33 of the resin case 26 is utilized, and a holding piece 340 is interposed between the step and the auxiliary terminals 25. Due to this structure, the projecting portion 25a properly performs the function to block an external force, preventing the auxiliary terminals 25 from being led into poor external connection and the insulated circuit board 21 from being broken. The holding piece 340 is made of an insulating material such as a resin. FIG. 2A is a perspective view of the holding piece 340 and FIG. 2B is a sectional view of an essential part including the holding piece 340 of a semiconductor module. As shown in FIGS. 2A and 2B, the holding piece 340 has a rectangular (quadrilateral) cross-section. One of the surfaces of the holding piece 340 is contacting the auxiliary terminals 25. A second recess 260 is formed from the partial upper surface 26a of the resin case 26. The holding piece 340 is inserted into the second recess 260 so that the holding piece 340 pushes the projecting portion 25a formed on the auxiliary terminal 25 against the first recess 40 in the resin case 26. This structure keeps the projecting portion 25a being engaged with the first recess 40 of the resin case 26 even when an external force acts on the auxiliary terminal 25 in the leftward direction in FIG. 2B. Thus, external force acting on the auxiliary terminal 25 in the vertical direction does not generate large stress at the bottom part of the auxiliary terminal 25.

Second Embodiment

The following describes the second embodiment of the present invention. As shown in FIG. 9B, a holding piece 341 in the second embodiment has a surface 50 to contact the auxiliary terminals 25 and another surface 51 opposite to the surface 50, the surface 51 being angled so that the cross-section of the holding piece 341 becomes smaller in the lower position. The surface 52 of the resin case 26 corresponding to the inclined surface 51 is also inclined so as to fit to the surface 51 of the holding piece 341.

This structure allows the projecting portion 25a to push against the first recess 40 more strongly as the holding piece 341 is inserted into the second recess 261 in comparing with the structure of the first embodiment. By setting an inserting depth of the holding piece 341 properly, a large dimensional tolerance is allowed in the width of the holding piece 341 and the width of the second recess 261 in the horizontal direction in FIG. 9A. This structure maintains a state in which the projecting portion 25a is fitted in the first recess 40 of the resin case 26 even when an external force acts on the auxiliary terminals 25 in the leftward direction in FIG. 9A. Thus, external force acting on the auxiliary terminal 25 in the vertical direction does not generate large stress at the bottom part of the auxiliary terminal 25. Therefore, the structure of the second embodiment eliminates poor external connection of the auxiliary terminals 25 and breakage of the insulated circuit board 21.

Third Embodiment

The following describes the third embodiment of the present invention. As shown in FIG. 10, a holding piece 342 in the third embodiment has slits 55 formed at the places corresponding to the respective auxiliary terminals 25 to fit to the terminals. This structure restricts movement of the auxiliary terminals 25 in the direction of the shorter side of the opening 28b for an auxiliary terminal due to an external force in the same direction. The slits 55 can be formed in the holding piece 341 of the second embodiment to obtain the same effects as in the second embodiment.

Fourth Embodiment

The following describes the fourth embodiment of the present invention. As shown in FIG. 11, a holding piece 343 in the fourth embodiment has third recesses 60 at least on two surfaces next to the surface contacting the auxiliary terminals 25. The resin case 26 has projecting portions corresponding to these third recesses 60. This structure securely fixes the holding piece 343, and is favorable because the structure fixes the auxiliary terminals 25 rigidly in the width direction i.e. shorter side direction of the terminals. The third recesses 60 and the projecting portions formed on the resin case corresponding to the recesses 60 can be exchanged with each other, i.e., protrusions are formed on the holding piece 343 and recesses are formed on the resin case 26. In addition, the projecting portion can have a configuration with a flat top surface and an inclined downward surface, the recess having a configuration to fit to such a projecting portion. Moreover, this structure can be applied to the second and third embodiments.

Fifth Embodiment

The following describes the fifth embodiment of the present invention. In the fifth embodiment, the holding pieces 340, 341, 342, and 343 in the first through fourth embodiments are adhered to the recessed parts formed in the resin case 26 corresponding to the holding pieces. Adhering the holding piece secures the projecting portion 25a engaged with the first recess 40 of the resin case 26 even when an external force acts on the auxiliary terminal 25 in the leftward direction in FIG. 2B, for example. Thus, external force acting on the auxiliary terminal 25 in the vertical direction does not generate large stress at the bottom part of the auxiliary terminal 25.

Figure 13:
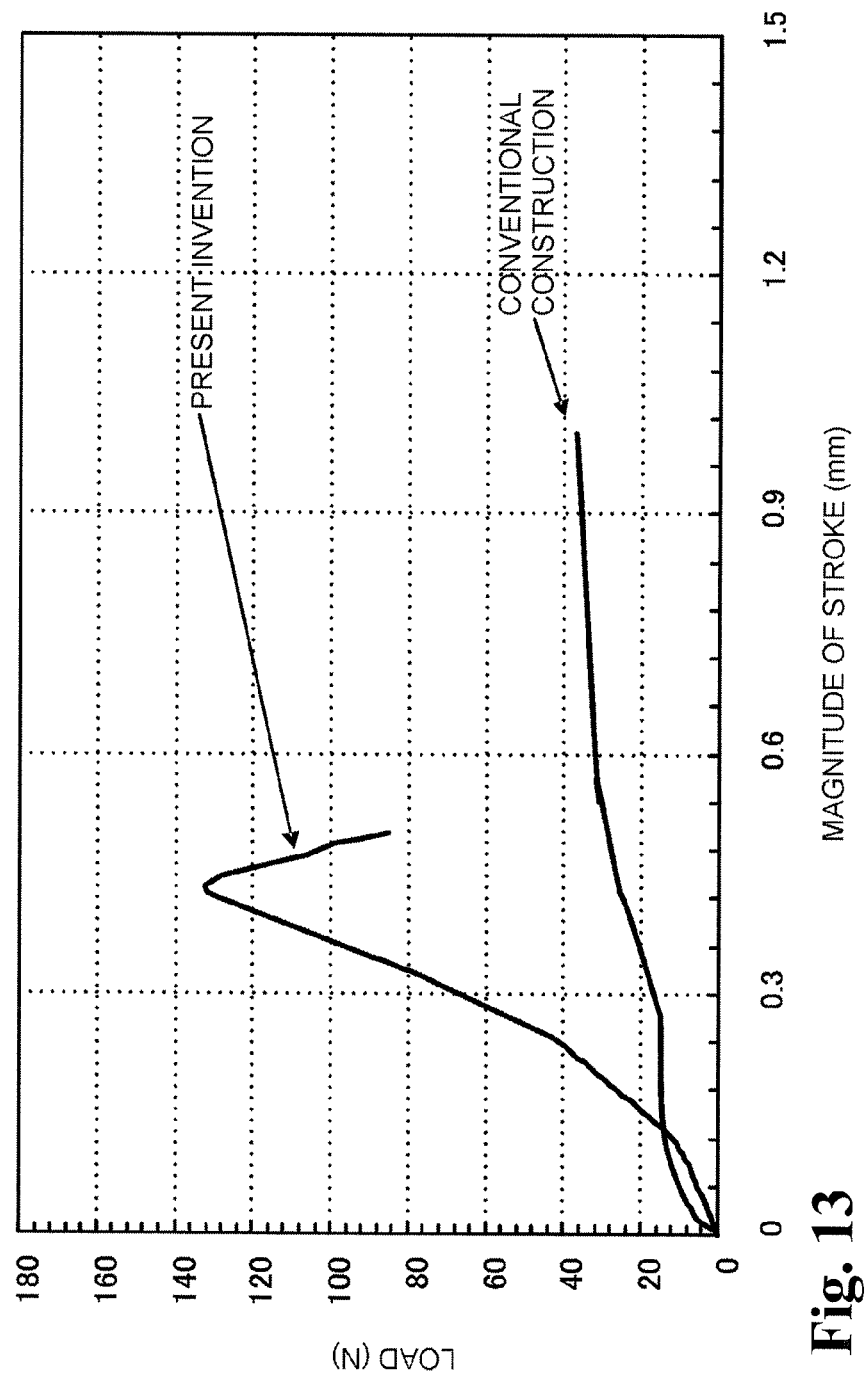
FIG. 13 shows a relationship between a downward load [N] on an auxiliary terminal and a sunken stroke [mm] of the auxiliary terminal in a semiconductor module of the invention and in a conventional semiconductor module.

The inventor of the present invention has studied about relationship between a downward load [N] on an auxiliary terminal 25 and a sunken stroke [mm] of the auxiliary terminal 25 for cases of with and without a holding piece of the invention. Large sunken stroke of the auxiliary terminal 25 means poor performance to block stress generation by the projecting portion 25a of the auxiliary terminal 25. FIG. 13 shows the measurement result.

FIG. 13 shows that the structure having a holding piece (340, 341, 342, 343) between the auxiliary terminal 25 and a part of the resin case according to the invention performs effective function to block stress generation by the projecting portion 25a against a downward load on the auxiliary terminal 25 larger than 100 [N]; the sunken stroke of the auxiliary terminal was only 0.4 [mm] with a load of 120 [N]. In contrast, a conventional structure without the holding piece, the load on the auxiliary terminal 25 was not able to increase to 40 [N] while the sunken stroke reached 1 [mm], indicating loss of the function to block stress generation by the projecting portion 25a.

The holding pieces 340, 341, 342, and 343 can be made of the same material as that of the resin case 26. An insulating resin material different from that of the resin case 26 can also be used. The material can be a ceramic plate. A length of the holding piece is sufficient with a dimension that allows fixing of all auxiliary terminals 25.

Now, a method of manufacturing a semiconductor module according to the present invention will be described below. The insulated circuit board 21 is fixed on the metallic base plate 20; the semiconductor elements such as an IGBT and a FWD are fixed with solder at predetermined places on the insulated circuit board 21; and the main terminals 24 for main current and the auxiliary terminals 25 including control terminals are fixed at predetermined places. Then, the circuit components are assembled on the metallic base plate 20. With the base plate of assembled metallic base plate 20, the resin case 26 (or 260a and 260b in FIG. 9A) having the bottom opening is engaged. The main terminals 24 are exposed from the openings 28a for the main terminals provided on the higher flat surface 32 of the resin case 26 (or 260a and 260b); and the auxiliary terminals 25 are exposed from the openings 28b for the auxiliary terminals provided on the lower flat surface 33 of the resin case 26 (or 260a and 260b). Then, the nut globe 27, which is a nut-receiving resin body, is inserted from the inserting hole 29 formed at the side surface opposite to the side of the auxiliary terminals 25. After that, the holding piece 340 (or 341, 342, 343) is fitted between the higher flat surface 32 and the auxiliary terminals 25. Thus, the auxiliary terminals 25 are surely fixed in the longitudinal direction of the slit of the opening 28b for auxiliary terminal 25. Therefore, an external downward force exerted on the auxiliary terminals 25 during a connecting process of an external connector to the auxiliary terminals will never cause poor connection of external terminals and breakage of the insulated circuit board.

What is claimed is:
1. A semiconductor module comprising:
a metallic base plate;
an insulated circuit board fixed on the metallic base plate;
a semiconductor element mounted on the insulated circuit board;
a resin case housing the semiconductor element, and having an upper face with an opening;
a terminal exposed from the opening of the upper face of the resin case to an outer portion in a vertical direction; and an insulating holding piece having a triangular or a quadrilateral cross-section and one surface contacting the terminal, wherein the terminal has a projecting portion disposed inside the resin case to restrict a movement of the terminal in the vertical direction; and the resin case has a first recess portion to fit the projecting portion and a second recess portion disposed on the upper surface of the resin case so that the holding piece pushes the projecting portion on the terminal toward the first recess portion for insertion.

2. The semiconductor module according to claim 1, wherein the holding piece has an inclined surface on a surface opposite to a surface contacting the terminal, the inclined surface being inclined to reduce a cross-section of the holding piece toward a lower portion, and a surface of the resin case corresponding to the inclined surface of the holding piece has an inclined surface to contact the inclined surface of the holding piece.

3. The semiconductor module according to claim 1, wherein the holding piece has a slit at a position corresponding to the terminal, and the slit is inserted with the terminal.

4. The semiconductor module according to claim 1, wherein the holding piece has at least two surfaces having a projecting portion or recess portion, and the resin case has a recess portion or projecting portion corresponding to the projecting portion or recess portion of the holding piece.

5. The semiconductor module according to claim 1, wherein the holding piece is fixed to the second recess portion on the resin case.

6. A method of manufacturing a semiconductor module, comprising the steps of:

fixing a semiconductor element and a terminal on an insulated circuit board fixed on a metallic base plate; and fixing a resin case onto the metallic base plate, the resin case housing the semiconductor element and leading the terminal from an opening provided on an upper surface of the resin case to an outer portion in a vertical direction;

wherein after the terminal is exposed from the opening of the resin case, a holding piece is inserted into a second recess portion of the resin case so that the holding piece pushes a projecting portion formed on the terminal toward a first recess on the resin case.

\* \* \* \* \*

UNITED STATES PATENT AND TRADEMARK OFFICE
CERTIFICATE OF CORRECTION

| | | |
|---|---|---|
| PATENT NO. | : 8,975,740 B2 | Page 1 of 1 |
| APPLICATION NO. | : 14/109233 | |
| DATED | : March 10, 2015 | |
| INVENTOR(S) | : Horie | |

It is certified that error appears in the above-identified patent and that said Letters Patent is hereby corrected as shown below:

In the Specification

Column 1, line 26, delete "circuit hoard 21" insert --circuit board 21--.

Signed and Sealed this
Twenty-third Day of June, 2015

Michelle K. Lee
*Director of the United States Patent and Trademark Office*